(12) United States Patent  (10) Patent No.: US 7,472,795 B2
Dubon et al.  (45) Date of Patent: Jan. 6, 2009

(54) ANTI-SAG MANAGEMENT ASSEMBLY

(75) Inventors: William Dubon, Bloomingdale, IL (US); Ronan Stephens, Berwyn, IL (US); Donald Anderson, Oak Park, IL (US)

(73) Assignee: Pentair Electronic Packaging Company, Des Plaines, IL (US)

( * ) Notice: Subject to any disclaimer, the term of this patent is extended or adjusted under 35 U.S.C. 154(b) by 539 days.

(21) Appl. No.: 11/004,519

(22) Filed: Dec. 3, 2004

(65) Prior Publication Data

US 2005/0145582 A1    Jul. 7, 2005

Related U.S. Application Data

(60) Provisional application No. 60/527,613, filed on Dec. 5, 2003.

(51) Int. Cl.
*A47F 7/00* (2006.01)

(52) U.S. Cl. ........................................................ 211/26
(58) Field of Classification Search ................ 211/26, 211/175; 312/223.2; 361/826, 683; 174/69; 248/49, 282.1
See application file for complete search history.

(56) References Cited

U.S. PATENT DOCUMENTS 6,305,556 B1 * 10/2001 Mayer ............................ 211/26
6,326,547 B1 * 12/2001 Saxby et al. .................. 174/69
6,600,665 B2 * 7/2003 Lauchner ...................... 361/826
6,715,718 B1 * 4/2004 Chen et al. .................... 248/49
6,945,504 B2 * 9/2005 Chen et al. .................. 248/282.1

* cited by examiner

*Primary Examiner*—Sarah Purol
(74) *Attorney, Agent, or Firm*—Greenberg Traurig, LLP

(57) ABSTRACT

An anti-sag management assembly includes a cross member operatively coupled at opposed first and second ends to brackets that are adapted for movable engagement with stationary portions of first and second telescoping slide assemblies. A slider movably engages the cross member. A first arm is operatively coupled to an arm bracket that is adapted for connection to a movable portion of the first telescoping slide assembly and to the slider. A second arm operatively coupled to a second arm bracket that is adapted for connection to the stationary portion of the first telescoping slide assembly and to the slider. Upon extension of the movable portion of the telescoping slide rail assemblies the slider is moved from a first operative position adjacent the second member bracket to a second operative position adjacent the first member bracket and upon retraction of the device the slider is moved from the second operative position to the first operative position.

21 Claims, 3 Drawing Sheets

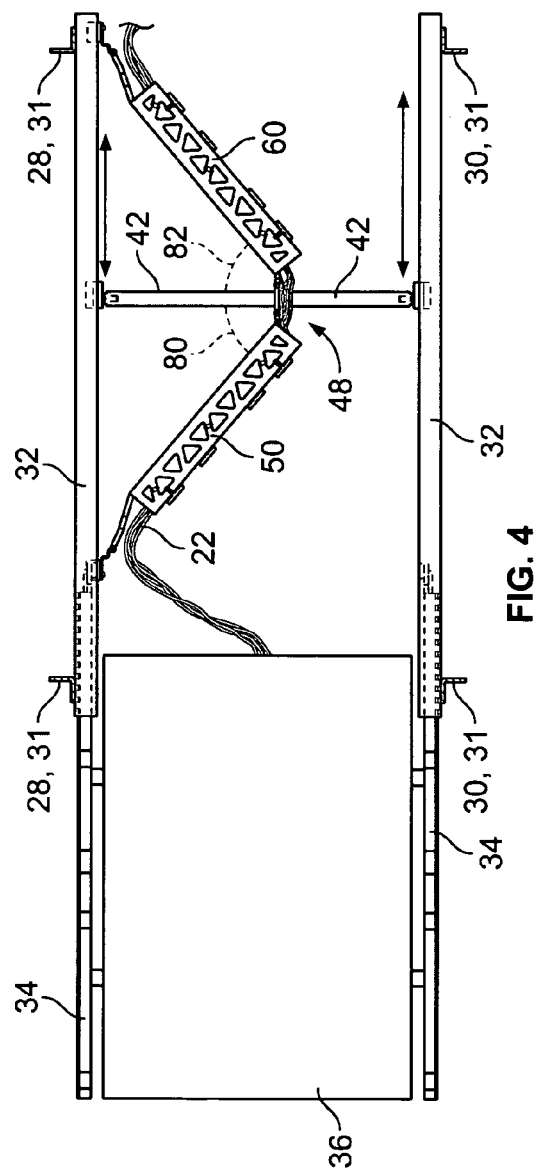
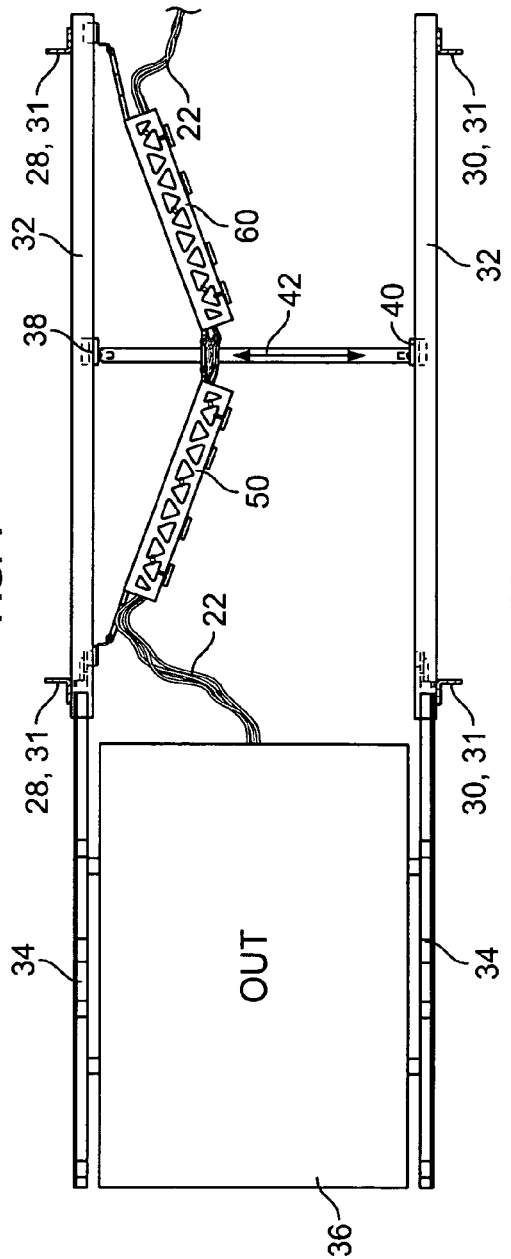

ANTI-SAG MANAGEMENT ASSEMBLY

CROSS-REFERENCE TO RELATED APPLICATIONS

This application claims the benefit of U.S. Provisional Application Ser. No. 60/527,613, filed Dec. 5, 2003, entitled "Cable Management and Anti-Sagging Arm".

BACKGROUND

This disclosure pertains to managing cables in a telecommunications rack, and more particularly, to an anti-sag management assembly for supporting cables in a telecommunications rack during extension and retraction of telecommunications equipment.

Presently, tele- and data-communication racks include a pair of opposing sides to which telescoping slide assemblies are connected for movable support of tele- and data-communication devices, namely, servers, power supplies, boxes or any other suitable device having cable attachments thereto, etc. Typically, in tele- and data-communication racks, there are often multiple devices disposed at different, vertically spaced levels that are usually closely adjacent. Wiring or cables extend from the device for connection outside the rack.

Problems arise with respect to controlling and supporting the cables that are connected to the devices when the devices are moved between the retracted and extended positions. When the device is moved to the extended position, the cables must move with the device. When the device is moved to the retracted position into the tele- and data-communication racks, the excess slack in the cable, which is necessary to extend the device, sags or hangs down below the device and interferes with other devices or the other telescoping slide rail assemblies and the cables are often damaged from such interference.

Therefore, there exists a need for a management assembly, which allows for the effective management of cables from devices to prevent sagging of the cables and damage as a result therefrom.

BRIEF DESCRIPTION OF THE DRAWINGS

Certain embodiments are shown in the drawings. However, it is understood that the present disclosure is not limited to the arrangements and instrumentality shown in the attached drawings, wherein:

FIG. 4 is a top plan view of the management assembly of FIG. 1 with the device being moved from the retracted position to an extended position; and FIG. 5 is a top plan view of the management assembly of FIG. 1 with the device in the extended position.

DETAILED DESCRIPTION

Figure 1:
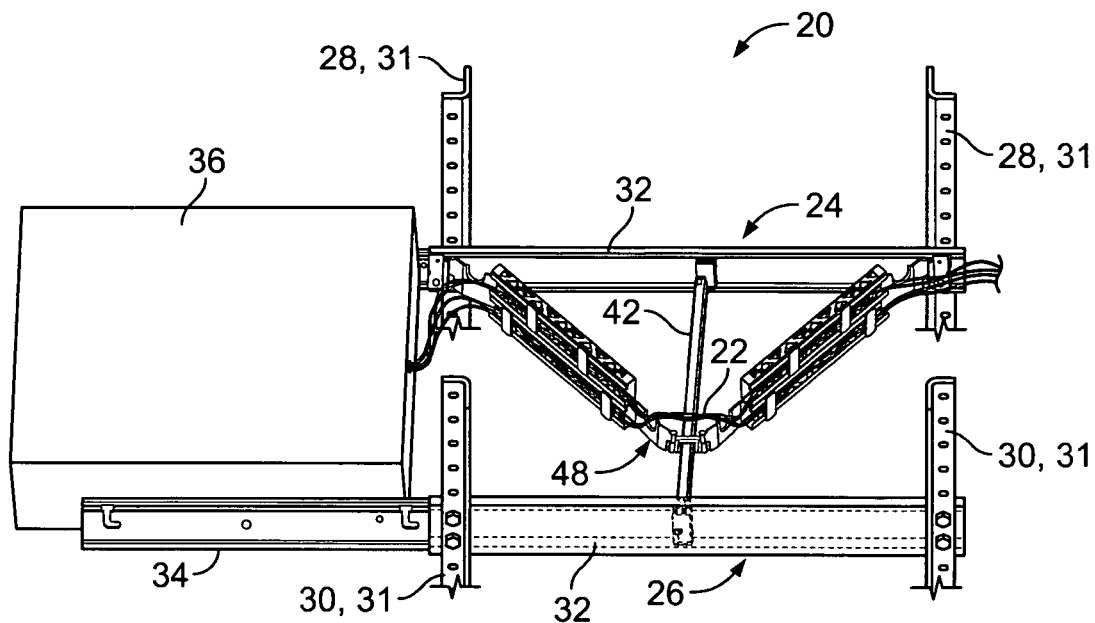
FIG. 1 is a perspective view of a management assembly installed in a rack.

For the purposes of promoting and understanding the principles disclosed herein, reference will now be made to the preferred embodiments illustrated in the drawings and specific language will be used to describe the same. It will nevertheless be understood that no limitation of the scope is thereby intended. Such alterations and further modifications in the illustrated device and such further applications are the principles disclosed as illustrated therein as being contemplated as would normally occur to one skilled in the art to which this disclosure relates.

In one principle aspect of the present disclosure, an anti-sag management assembly includes a cross member operatively coupled at opposed first and second ends to brackets that are adapted for movable engagement with stationary portions of first and second telescoping slide assemblies. A slider movably engages the cross member. A first arm is operatively coupled to an arm bracket that is adapted for connection to a movable portion of the first telescoping slide assembly and to the slider. A second arm operatively coupled to a second arm bracket that is adapted for connection to the stationary portion of the first telescoping slide assembly and to the slider. Upon extension of the movable portion of the telescoping slide rail assemblies the slider is moved from a first operative position adjacent the second member bracket to a second operative position adjacent the first member bracket and upon retraction of the device the slider is moved from the second operative position to the first operative position.

In another principle aspect of the present disclosure, an anti-sag management assembly for supporting a plurality of elongated elements includes a rack including opposed first and second sides and first and second telescoping slide assemblies each having a stationary portion and a movable portion. The first telescoping slide assembly is connected to the first side and the second telescoping slide assembly is connected to the second side. A device engages the movable portions of the first and second telescoping slide assemblies, such that the device and the movable portions are movable between a retracted position to an extended position. First and second member brackets each respectively movably engage the stationary portion of the first and second telescoping slide assemblies. A cross member is operatively coupled at respective opposed first and second ends to the first and second member brackets and a slider movably engages the cross member. A first arm bracket is operatively coupled to the movable portion of the first telescoping slide assembly and a first arm having a first inner end is operatively coupled to the first arm bracket, and a first outer end is operatively coupled to the slider. A second arm bracket is operatively coupled to the stationary portion of the first telescoping slide assembly and a second arm having a second inner end is operatively coupled to the second arm bracket, and a second outer end is operatively coupled to the slider. Upon movement of the device and movable portions of the first and second telescoping slide assemblies from the retracted position to the extended position the slider is moved from a first operative position adjacent the second member bracket to a second operative position adjacent the first member bracket and upon movement of the device and the movable portions of the first and second telescoping slide assemblies from the extended position to the retracted position the slider is moved from the second operative position to the first operative position.

FIG. 1 illustrates a perspective view of an anti-sag management assembly 20 for supporting a plurality of elongated elements 22. The anti-sag management assembly 26 is operatively associated with a first 24 and a second 26 telescoping slide assembly, which are respectively connected to opposed first 28 and second 30 sides of a rack 31. The first and second telescoping side assemblies 24, 26 each have a stationary portion 32 and a movable portion 34. The stationary portion 32 of the first telescoping slide assembly 24 is connected to the first side 28 and the stationary portion 32 of the second telescoping slide assembly 26 is connected to the second side 30. The movable portions 34 telescope outwardly with respect to the first and second telescoping slide assemblies 24, 26. It will be recognized by those of skill in the art that the first and second telescoping slide assemblies 24, 26 may include presently available 2- and 3-rail assemblies. It is also within the teachings of the present disclosure that any other, suitable telescoping assembly which has a stationary part and a movable part may be used in connection with the management assembly 20 to achieve functions described herein.

A device 36 engages the movable portions 34 of the first and second telescoping slide assemblies 24, 26. It is within the teachings of the present disclosure that the device may be an electronic or tele- and data-communication device or any other suitable device from which wires or cables extend for connection outside the rack. For example, the device may be a server, power supply, box or any other suitable device having cables attached thereto. The device 36 and the movable portions 34 of the first and second telescoping slide assemblies 24, 26 are movable with respect to the stationary portions 32 of the first and second telescoping slide assemblies 24, 26 and the rack 32 between a retracted position, as shown FIG. 3, to an extended position, as shown in FIG. 5.

Figure 2:
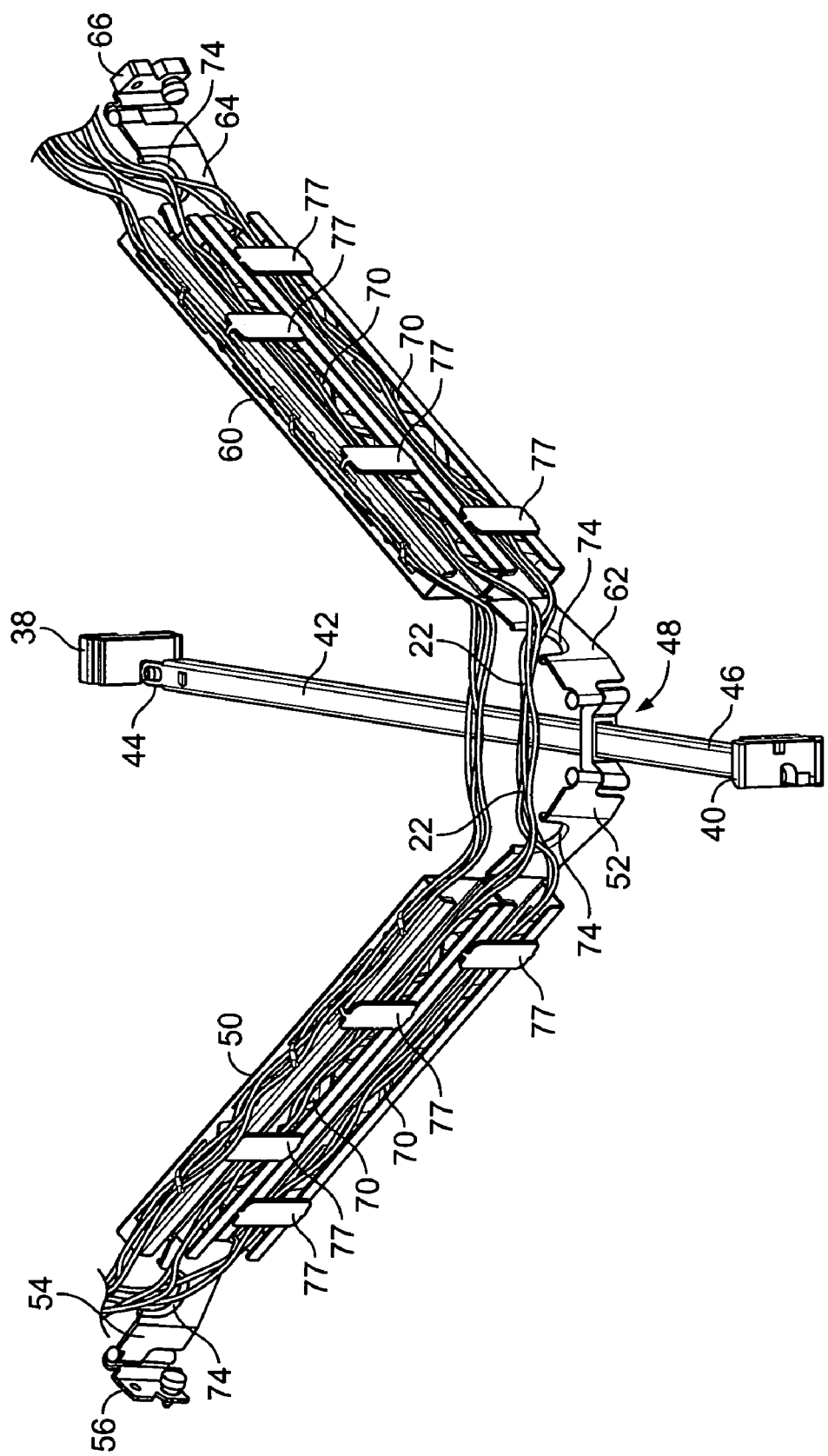
FIG. 2 is a perspective view of the management assembly of FIG. 1.

FIG. 2 illustrates a perspective view of the management assembly 20 of FIG. 1 where the rack 32, telescoping slide assemblies 24, 26 and device 36 have been removed for clarity. The management assembly 20 is adapted to engage the stationary and movable portions 32, 34 of the pair of opposed first and second telescoping slide assemblies 24, 26 that facilitate mounting of the device 36 in the rack 32. The management assembly 20 supports a plurality of elongated elements 22 during extension and retraction of the device 36 and the movable portions 34 of the first and second telescoping assemblies 24, 26 to achieve the advantages discussed above.

First 38 and second 40 member brackets each respectively movably engage the stationary portion 32 of the first and second telescoping slide assemblies 24, 26, as may also be seen in FIG. 1. A cross member 42 is operatively coupled at respective first 44 and second 46 ends to the first and second member brackets 38, 40. It is within the teachings of the present disclosure that the operative coupling between the cross member 42 and the first and second member brackets 38, 40 may be accomplished in a suitable manner. For example, a post may be formed on the first and second member brackets 38, 40 which is pivotally engaged by apertures formed at the opposed first and second ends 44, 46 of the cross member 42, the first and second member brackets 38, 40 may have an aperture formed therein to engage a pivot post disposed at each of the first and second ends 44, 46 of the cross member 42 or any other suitable manner. It will be recognized by those of skill in the art that any operative coupling which permits relative movement between the cross member 42 and the first and second member brackets 38, 40 is within the teachings of the present disclosure.

The first and second member brackets 38, 40 movably engage the stationary portion 32 of the first and second telescoping slide assemblies 24, 26 in any suitable manner. For example, in one embodiment, the first and second member brackets 38, 40 include a main body portion to which the cross member 42 is operatively coupled and a pair of opposed offset flanges which engage the channels of the stationary portion 32 of the first and second telescoping slide assemblies 24, 26.

A slider 48 movably engages the cross member 42. It is within the teachings of the present disclosure that the slider 48 may be formed of any suitable matter and have any suitable configuration to permit sliding engagement between the slider 48 and the cross member 42. Preferably, the slider 48 and the first and second member brackets 38, 40 are formed from a plastic material which has a low co-efficient of friction with respect to the material construction of the cross member 42. The slider 48 includes structure to facilitate moveable engagement with other components of the management assembly 20 as will be discussed in more detail below.

It is within the teachings of the present disclosure that the cross member 42 may be configured in any suitable manner from any suitable material. For example, the cross member 42 may be a bar made of metal, plastic, natural or synthetic material, or any other suitable matter, or the cross member 42 may be formed from a generally flexible element that is used generally drawn tight between the first and second member brackets 38, 40. For example, such a flexible element may be a wire, string, rope, natural or synthetic filament or any other suitable material. Those of skill in the art will recognize that the cross member 42 provides anti-sagging support to the management assembly 20.

It will further be recognized that the slider 48 may also be formed of any suitable material and in any suitable configuration to achieve the functions set forth herein. For example, the slider 48 may be formed from plastic, metal, natural or synthetic materials or any other suitable material. In one embodiment the slider 48 may be formed from a synthetic material and have an aperture generally configured to slideably receive the cross member 42 to permit relative movement therebetween. It is within the teachings of the present disclosure that the configuration of the slider 48 may be any suitable structure to facilitate operative coupling with the first and second arms 50, 60 as discussed in more detail below.

A first arm 50 is operatively coupled at a first outer end 52 to the slider 48. The first arm 50 also includes a first inner end 54 that is operatively coupled to a first arm bracket 56. As discussed above with respect to the interface between the cross member 42 and the first and second member brackets 38, 40, the first inner and outer ends 54, 52 may be connected to the respective first arm bracket 56 and slider 48 in any suitable manner which permits relative movement therebetween. Preferably, in one embodiment a pivotal connection may be provided.

The first arm bracket 56 is operatively coupled to the movable portion 34 of the first telescoping slide assembly 24, as shown in FIG. 1. It is within the teachings of the present disclosure that such operative couplings may include any suitable connection there between. For example, alignment pins, threaded fasteners, adhesive, welding, rivets, and any other suitable connection device may be used. It will be recognized by those of skill in the art that the preferred form of coupling will not require the use of tools.

A second arm 60 includes a second outer end 62 that is operatively coupled to the slider 48 and a second inner end 64 that is operatively coupled to a second arm bracket 66 which is operatively coupled to the stationary portion 32 of the first telescoping slide assembly 24. It is within the teachings of the present invention that any or all of the disclosed manners of operatively coupling discussed above may also be used likewise with respect to the second arm 60 at either of the respective outer and inner ends 62, 64 and also any other suitable manner of connection may also be provided.

The first and second arms 50, 60 may be configured in any suitable manner of any suitable material. In one embodiment, the first and second arms 50, 60 have a truss structure. In another embodiment, the first and second arms are configured to include at least one channel 70. As may be seen in FIGS. 1 and 2, the first and second arms 50, 60 generally have a truss structure and a pair of channels 70. The elongated elements may be routed in any suitable manner, such as disposed on a top 72 of the first and second arm 50, 60, through at least one channel 70 or in any other suitable manner. Preferably, at one least strap 77 is included in connection with the first and second arms 50, 60 to facilitate retention of the elongated elements 22. Furthermore, notches 74 may be formed in the first and second arms 50, 60 adjacent the respective inner and outer ends 54 and 64, 52, 62 to facilitate routing of the elongated elements 22.

Figure 3:
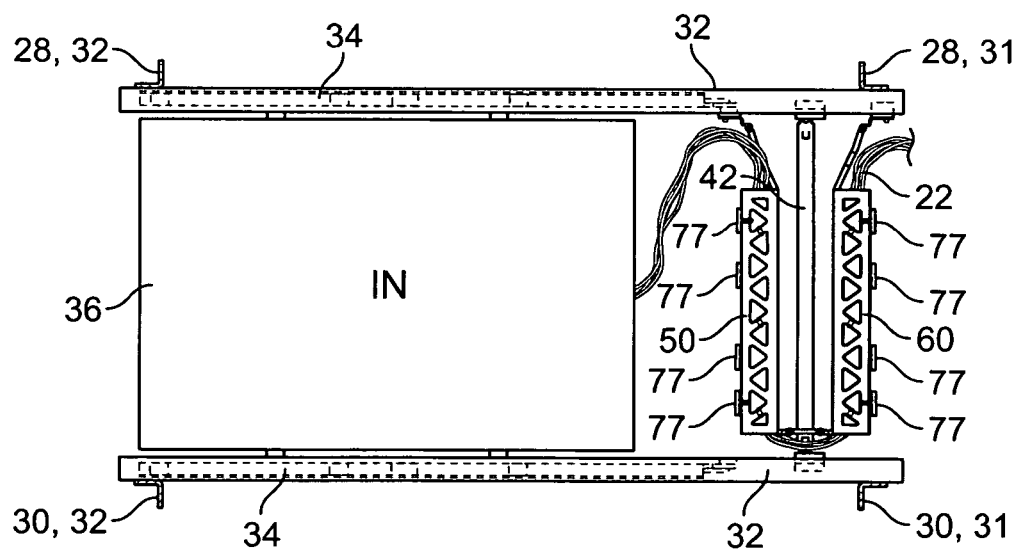
FIG. 3 is a top plan view of the management assembly of FIG. 1 with a device in a retracted position.

In operation, as may be seen in FIGS. 3-5, upon movement of the device 36 and movable portions 34 of the first and second telescoping slide assemblies 24, 26 from the retracted position, as may be seen in FIG. 3, to the extend position, as may be seen in FIG. 5, the slider 48 is moved from a first operative position, as may be seen in FIG. 3, adjacent to the second member bracket 40 to a second operative position, as may be seen in FIG. 5, adjacent the first member bracket 38. Upon movement of the device 36 and the movable portions 34 of the first and second telescoping slide assemblies 24, 26 from the extended position, as may be seen in FIG. 5 to the retracted position as may be seen in FIG. 3, the slider 48 is moved from the second operative position as may be seen in FIG. 5 to the first operative position as may be seen in FIG. 3. Those of skill in the art will recognize that the slider 22 is supported by the cross member 42 during its movement from the first operative position to the second operative position as a result of the first and second member brackets 38, 40 movably engage the stationary portion 32 of the first and second telescoping slide assemblies 24, 26. In other words, the cross member 42 is continuously generally centrally disposed between the first and second arm brackets 56, 66.

As may be seen in FIG. 4, a first angle 80 is defined between the first arm 50 and the cross member 42 and a second angle 82 is defined between the second arm 60 and the cross member 42. The first and second angles 80, 82 increase as the slider 48 is moved from the first operative position to the second operative position. Likewise, the first and second angles 80, 82 decrease as the slider is moved from the second operative position to the first operative position. It is within the teachings of the present disclosure that the first and second angles 80, 82 are generally substantially similar throughout movement of the device 36 and the moveable portions 34 of the first and second telescoping slide assemblies 24, 26 between the retracted position and the extended position.

It is within the teachings of the present disclosure that the management assembly may also be connected to the second telescoping slide assembly 26 to achieve the same function as described above.

Those of skill in the art will recognize that the configuration of the management assembly 20 maintains the elongated elements 22 disposed coplanar with the device 36. Accordingly, the disadvantages of prior designs is overcome.

The anti-sag management assembly 20 of FIG. 2, may be readily incorporated into existing telescoping rail systems within electronic or telecommunication racks. Cable management is achieved through snaking any elongated elements 22 through the back of the device 36 and across the first arm 50 and the second arm 60.

As the required length of cable is not affected by the positioning of the first arm 50 and the second arm 60, there must always be approximately the same length of cable. Thus, when the device is moved to an extended position, the elongated elements are re-orientated in conjunction with the arms 50 and 60, but the length of the elongated elements are not adjusted. And as such, when the device 36 is retracted back into the rack, the arms 50 and 60 refold and the elongated elements are re-positioned with the arms 50 and 60. Therefore, there is no excess slack in the elongated elements and the elongated elements then will not hang outside of the co-planar space of the device 36 and interfere with other devices within the rack. It is within the teachings of the present disclosure that the elongated elements may be cables, wires, or any other suitable device or element for electrical power or signal transmission.

Furthermore, while the particular preferred embodiments have been shown and described, it will be obvious to those skilled in the art that changes and modifications may be made without departing from the teaching of the disclosure. The matter set forth in the foregoing description and accompanying drawings is offered by way of illustration only and not as limitation. The actual scope of the disclosure is intended to be defined in the following claims when viewed in their proper perspective based on the related art.

What is claimed is:

1. An anti-sag management assembly, adapted to engage stationary and movable portions of a pair of opposed first and second telescoping slide assemblies that facilitate mounting a device in a rack, for supporting a plurality of elongated elements during extension and retraction of the device and the movable portion of the first and second telescoping slide assemblies, the management assembly comprising:
   a cross member operatively coupled at respective opposed first and second ends to first and second member brackets, each of the first and second bar brackets adapted for movable engagement with the stationary portions of one of the first and second telescoping slide assemblies;
   a slider movably engaging the cross member;
   a first arm having a first inner end operatively coupled to a first arm bracket, that is adapted for connection to the movable portion of the first telescoping slide assembly, and a first outer end operatively coupled to the slider; and
   a second arm having a second inner end operatively coupled to a second arm bracket, that is adapted for connection to the stationary portion of the first telescoping slide assembly, and a second outer end operatively coupled to the slider; wherein upon extension of the device the slider is moved from a first operative position adjacent the second member bracket to a second operative position adjacent the first member bracket and upon retraction of the device the slider is moved from the second operative position to the first operative position.

2. The management assembly as recited in claim 1, wherein the cross member is continuously generally centrally disposed between the first and second arm brackets.

3. The management assembly as recited in claim 1, wherein a first angle defined between the first arm and the cross member and a second angle defined between the second arm and the cross member increases as the slider moves from the first operative position to the second operative position.

4. The management assembly as recited in claim 1, wherein the first and second arms have a truss structure.

5. The management assembly as recited in claim 1, wherein the first and second arms are pivotally connected to the slider and to the first and second arm brackets, respectively.

6. The management assembly as recited in claim 1, wherein the first and second arms are configured to include at least one channel.

7. The management assembly as recited in claim 6, wherein the elongated elements are routed through the at least one channel.

8. The management assembly as recited in claim 1, wherein the first and second arms have notches formed therein adjacent the respective inner and outer ends to facilitate routing of the elongated elements.

9. The management assembly as recited in claim 1, wherein the first and second arms each include at least one strap to retain the elongated elements.

10. An anti-sag management assembly for supporting a plurality of elongated elements comprising:
a rack including opposed first and second sides;
first and second telescoping slide assemblies each having a stationary portion and a movable portion, the first telescoping slide assembly connected to the first side and the second telescoping slide assembly connected to the second side;
a device engaging the movable portions of the first and second telescoping slide assemblies, such that the device and the movable portions of the first and second telescoping slide assemblies are movable between a retracted position to an extended position;
first and second member brackets each respectively movably engaging the stationary portion of the first and second telescoping slide assemblies;
a cross member operatively coupled at respective opposed first and second ends to the first and second member brackets;
a slider movably engaging the cross member;
a first arm bracket operatively coupled to the movable portion of the first telescoping slide assembly;
a first arm including a first inner end operatively coupled to the first arm bracket and a first outer end operatively coupled to the slider;
a second arm bracket operatively coupled to the stationary portion of the first telescoping slide assembly; and
a second arm having a second inner end operatively coupled to the second arm bracket and a second outer end operatively coupled to the slider;
wherein upon movement of the device and movable portions of the first and second telescoping slide assemblies from the retracted position to the extended position the slider is moved from a first operative position adjacent the second member bracket to a second operative position adjacent the first member bracket and upon movement of the device and the movable portions of the first and second telescoping slide assemblies from the extended position to the retracted position the slider is moved from the second operative position to the first operative position.

11. The management assembly as recited in claim 10, wherein the cross member is continuously generally centrally disposed between the first and second arm brackets.

12. The management assembly as recited in claim 11, wherein a first angle defined between the first arm and the cross member and a second angle defined between the second arm and the cross member increases as the slider moves from the first operative position to the second operative position.

13. The management assembly as recited in claim 11, wherein the first and second arms have a truss structure.

14. The management assembly as recited in claim 11, wherein the elongated elements are cables.

15. The management assembly as recited in claim 11, wherein the device is an electronic component.

16. The management assembly as recited in claim 15, wherein the electronic component is a server.

17. The management assembly as recited in claim 11, wherein the elongated elements are disposed on a top of the first and second arms.

18. The management assembly as recited in claim 11, wherein the first and second arms are configured to include at least one channel.

19. The management assembly as recited in claim 18, wherein the elongated elements are routed through the at least one channel.

20. The management assembly as recited in claim 11, wherein the first and second arms have notches formed therein adjacent the respective inner and outer ends to facilitate routing of the elongated elements.

21. The management assembly as recited in claim 11, wherein the first and second arms each include at least one strap to retain the elongated elements.

* * * * *